United States Patent [19]

Sakata et al.

[11] Patent Number: 5,236,870
[45] Date of Patent: Aug. 17, 1993

[54] METHOD OF MAKING A SEMICONDUCTOR INTEGRATED CIRCUIT UTILIZING INSULATORS WHICH REACT DISTINCTLY FROM EACH OTHER

[75] Inventors: Yasushi Sakata; Toshimichi Iwamori, both of Kanagawa, Japan

[73] Assignee: Fuji Xerox Co., Ltd., Tokyo, Japan

[21] Appl. No.: 797,169

[22] Filed: Nov. 26, 1991

Related U.S. Application Data

[60] Continuation of Ser. No. 521,403, May 10, 1990, abandoned, which is a division of Ser. No. 165,039, Mar. 7, 1988, Pat. No. 5,005,067.

[30] Foreign Application Priority Data

Mar. 12, 1987 [JP] Japan .................................. 62-57779

[51] Int. Cl.⁵ ............................................. H01L 21/44
[52] U.S. Cl. .................... 437/195; 437/231; 437/978; 156/643
[58] Field of Search .................... 437/195, 231, 978; 156/643

[56] References Cited

U.S. PATENT DOCUMENTS

| | | | |
|---|---|---|---|
| 4,353,159 | 10/1982 | Hsu | 437/195 |
| 4,367,119 | 1/1983 | Logan | 437/195 |
| 4,398,992 | 8/1983 | Fang et al. | 437/978 |

FOREIGN PATENT DOCUMENTS

| | | | |
|---|---|---|---|
| 60-210851 | 10/1985 | Japan . | |
| 62-291943 | 12/1987 | Japan | 437/195 |
| 63-169042 | 7/1988 | Japan | 437/195 |

OTHER PUBLICATIONS

S. Wolf et al., *Silicon Processing for the VLSI Era*, vol. 1, Lattice Press, Sunset Beach, CA, 1986, pp. 265-266, 546-551, 581-582.

S. K. Ghandhi, *VLSI Fabrication Principles*, John Wiley & Sons, New York, 1983, pp. 422-424.

*Primary Examiner*—Brian E. Hearn
*Assistant Examiner*—Laura M. Holtzman
*Attorney, Agent, or Firm*—Finnegan, Henderson, Farabow, Garrett & Dunner

[57] ABSTRACT

A semiconductor integrated circuit providing a novel patterned multilayered wiring structure to enhance the degree of the integration of the circuit and the speed of the operation. The structure includes at least one first interlaid electric insulator film on the wall of the contact portion of a first wiring layer and its vicinity, a second interlaid electric insulator film, which reacts distinctly to the etching process utilized from the first interlaid electric insulator film, is provided on a substrate.

2 Claims, 4 Drawing Sheets 5,236,870

METHOD OF MAKING A SEMICONDUCTOR INTEGRATED CIRCUIT UTILIZING INSULATORS WHICH REACT DISTINCTLY FROM EACH OTHER

This application is a continuation of application Ser. No. 07/521,403 filed May 10, 1990, which is a division of U.S. Pat. No. 5,005,067, filed Ser. No. 165,039, filed Mar. 7, 1988.

FIELD OF THE INVENTION

The present invention relates to a semiconductor integrated circuit, particularly to a semiconductor integrated circuit in wherein the interconnection of multilayer wiring conductors constitutes an improved structure, and the method of producing such is novel.

BACKGROUND OF THE INVENTION

The degree of the integration, the speed of the operation and the reliability of the circuit are greatly affected by the structure for the interconnection of wiring conductors and the method of making the structure.

The conventional art of connecting multilayered wiring conductors to each other is illustrated by the teachings of Japanese Patent Application (OPI) No. 36944/84 in FIG. 1 (the term "OPI" as used herein means an "unexamined published application"). As shown in FIG. 8(a), OPI 36944/84 discloses an interlaid electric insulator film 4' made of silicon dioxide, by a chemical vapor deposition process on the whole side of a first wiring layer 2 made of aluminum on a semiconductor substrate 1, a contact hole 6 is thereafter made in the film 4' by conventional photoetching, and a second wiring layer 3 made of aluminum is connected to the first wiring layer 2 through the contact hole to perform the interconnection of the multilayer wiring conductors.

In some cases, due to an alignment failure such as the deviation of the position of a mask in the photoetching, the contact hole 6 is not provided in a position completely coincident with that of the prescribed portion of the first wiring layer 2. As a result, the contact hole not only extends on the contact portion of the first wiring layer 2, but also extends to a lower wiring layer or the substrate thus causing a short circuit in the region outside the prescribed portion.

In an effort to solve this problem, as shown in FIG. 8(b), the cross-sectional area of the contact portion of the first wiring layer 2 is provided with an allowance a beforehand so as to be larger than that of the contact hole 6 to prevent the contact hole from extending to the lower wiring layer or the substrate due to the alignment failure. However, since the crosssectional area of the contact portion of the first wiring layer 2 is provided with the allowance a, the cross-sectional area is increased and restricts the enhancement of the degree of integration. is directly deposited on the first wiring layer 2, the wall of the layer is not properly covered with the film.

Furthermore, since the interlaid electric insulator film 4' is directly deposited on the first wiring layer 2, the wall of the layer is not properly covered with the film.

SUMMARY OF THE INVENTION

An object of the present invention is to overcome the problems and disadvantages of the prior art. Further objects of this invention are to provide a semiconductor integrated circuit wherein the contact hole is prevented from extending to a wrong lower layer in a multilayered wiring structure, the alignment process is simplified, and the cross-sectional area of a contact portion is reduced to enhance the degree of integration.

To achieve the objects and in accordance with the purpose of the invention, as embodied and broadly described herein, a semiconductor integrated circuit according to the present invention includes a substrate, multilayered wiring conductor having a first wall wherein at least one first interlaid electric insulator film is provided on the wall and in the vicinity of the first wall or extends outwardly in a sloped fashion from the wall and a second interlaid electric insulator film composed of material differing in etching properties from the first interlaid electric insulator. That is, the second interlaid electric insulator film has etching selectivity compared to the first interlaid electric insulator film. More precisely, the two materials react uniquely to the etching process utilized herein.

The method of manufacturing the semiconductor integrated circuit herein includes establishing a substrate, coating such with a first wiring layer by a sputtering process, performing photoetching, placing a first interlaid electric insulator film by a plasma chemical vapor process, performing anisotropic dryetching, layering down a second interlaid electric insulator film by pressure-reduction chemical vapor deposition, generating a contact hole, and, adding a second wiring layer via sputtering.

According to the present invention, the wall of a first wiring layer is not steeply, but is rather gradually, covered with a first interlaid electric insulator film, and the first wiring layer and the first interlaid electric insulator film are properly and uniformly covered with a second interlaid electric insulator film so that a second wiring layer is gradually provided on the second interlaid electric insulator film. As a result, the second wiring layer is less likely to be disconnected due to a height difference. Consequently, the reliability of a multilayer wiring structure is much enhanced.

Since the first interlaid electric insulator film prevents a contact hole from extending to a wrong lower layer due to an alignment failure when the contact hole is made in the second interlaid electric insulator film by etching, the width of the first wiring layer does not need to be provided with a large allowance For that reason, the cross-sectional area of the contact portion of the first wiring layer can be reduced to enhance the degree of integration.

BRIEF DESCRIPTION OF THE DRAWINGS

The accompanying drawings, which are incorporated in and constitute a part of this specification, illustrate several exemplary embodiments of the invention and together with the description, serve to explain the principles of the invention.

DESCRIPTION OF THE PREFERRED EMBODIMENT

In the semiconductor integrated circuit according to the present invention, at least one first interlaid electric insulator film is provided on the wall of the contact portion of a first wiring layer and the vicinity of the wall or extends to the region proximate to the wall in a manner loped from the actual wall. The top of the contact portion is not covered by the first interlaid electric insulator film. A second interlaid electric insulator film of differing etching properties from the first interlaid electric insulator film, is provided on a substrate and the first interlaid electric insulator film, and the first wiring layer and a second wiring layer are connected to each other through a contact hole provided in the second interlaid electric insulator film by etching. In the multilayered wiring structure provided the first interlaid electric insulator film stops the etching and therefore prevents the contact hole from extending to a layer under the first interlaid electric insulator film. This occurs even if the contact portion is not provided with a large allowance or the contact hole deviates from the contact portion.

Figure 1:
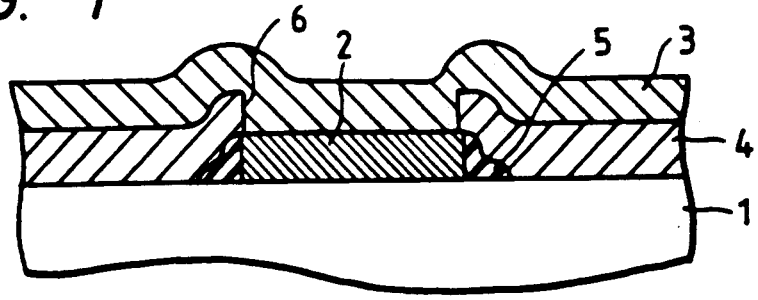
FIGS. 1 and 2 are cross-sectional views of the first embodiment of the semiconductor integrated circuit.

Reference will now be made in detail to the presently preferred embodiments of the invention, examples of which are illustrated in the accompanying drawings FIG. 1 shows the first embodiment of the present invention of a semiconductor integrated circuit. The semiconductor integrated circuit comprises a semiconductor substrate 1 made of silicon, a first wiring layer 2 made of aluminum, a second wiring layer 3 made of aluminum, a first interlaid electric insulator film 5 made of silicon nitride, and a second interlaid electric insulator film 4 made of silicon oxide. The first wiring layer 2 on the semiconductor substrate 1 and the second wiring layer 3 are connected to each other through a contact hole 6. Since the first interlaid electric insulator film 5 made of the silicon nitride is provided on the wall of the first wiring layer 2 and extends outwardly thereof in the vicinity of the wall, the contact portion of the first wiring layer 2 is barely provided with an allowance to connect the contact portion to that of the second wiring layer 3.

Figure 2:
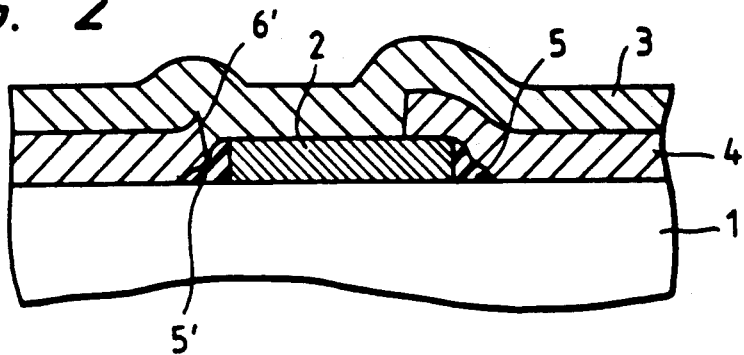

FIG. 2 illustrates a semiconductor integrated circuit wherein the contact hole generated is not in the desired position because of an alignment failure. However, proper contact is achieved as shown at 6', because the etching of the second interlaid electric insulator film 4 to make the contact hole is stopped on the silicon oxide film 4 and the silicon nitride film 5 which have different speeds of etching or reactions to the etching process, so that the contact hole does not extend to the silicon substrate 1.

Figure 3A:
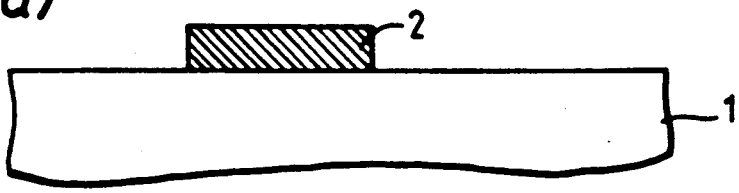
FIG. 3 is a multiple step cross-sectional representation of the method of manufacturing the first embodiment of the semiconductor integrated circuit.

An example of a method of manufacturing the first embodied semiconductor integrated circuit is now described with reference to FIG. 3. A thin film of aluminum of a thickness of 0.8 microns to 1 microns is made on the semiconductor substrate 1 of silicon by a conventional sputtering process. The material is then subjected to conventional photoetching so that the first wiring layer 2 is provided, as shown in FIG. 3(a).

Figure 3B:
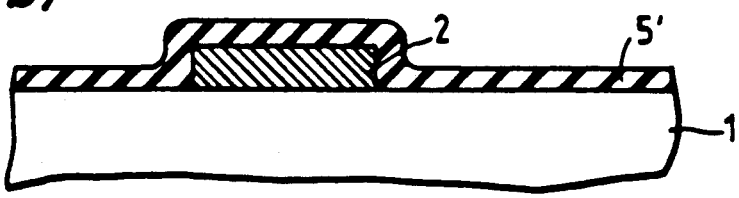

A silicon nitride film 5', as shown in FIG. 3(b) is deposited at a thickness of 0.4 microns to 0.6 microns on the substrate 1 and the first wiring layer 2 of aluminum by a plasma chemical vapor deposition process. The plasma chemical vapor deposition process is used because the silicon nitride film 5' can be made at a temperature of 350° C. or less and does not produce adverse effect, such as the generation of a hillock on the surface of the first wiring layer 2 of aluminum due to high-temperature treatment. Silicon nitride film 5' differs in etching property from the silicon oxide film 4 which is subsequently deposited.

Figure 3C:
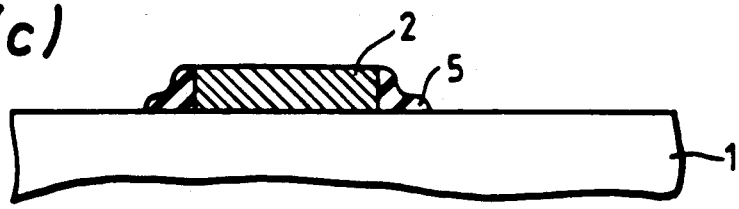

FIG. 3(c) indicates the step wherein anisotropic dry etching such as reactive ion etching is performed with the use of $CF_4+H_2$ gas on the silicon nitride film 5' until the top of the first wiring aluminum layer 2 of aluminum is exposed, so that the silicon nitride film 5 is left unetched on the wall of the aluminum layer and the vicinity of the wall. The silicon nitride film 5 thus functions as the first interlaid electric insulator film.

Figure 3D:
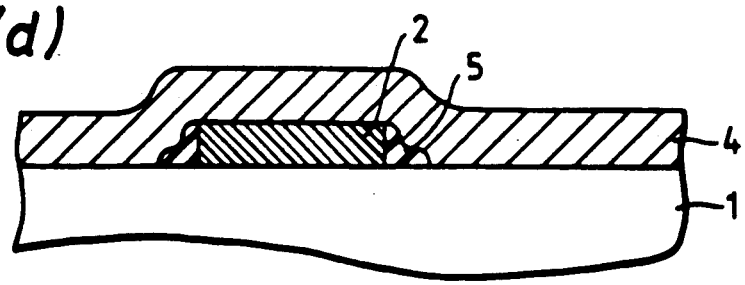

As shown in FIG. 3(d), the second interlaid electric insulator film 4 of the silicon oxide is made at a thickness of 1.5 microns to 2.0 microns by a pressure-reduction chemical vapor deposition process so that the silicon oxide film functions as the second interlaid electric insulator film 4. Since the silicon nitride film 5 is already provided on the wall and the proximate vicinity thereof of the first wiring layer 2 of aluminum so that the top of the first wiring layer 2 and that of the silicon substrate 1 are gradually bridged to each other by the silicon nitride film, the first wiring layer is properly covered with the silicon oxide film.

Figure 3E:
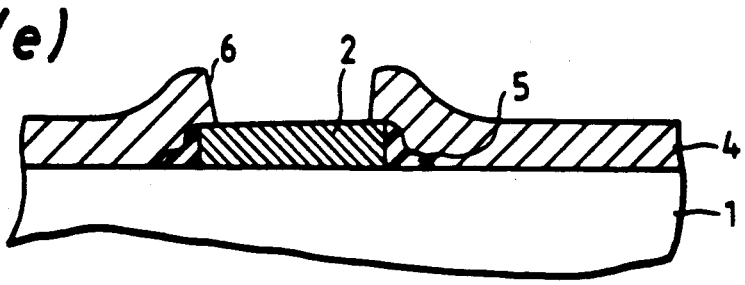

FIG. 3(e) demonstrates that the contact hole 6 is made in the desired portion of the second interlaid electric insulator film 4 of silicon oxide by conventional photoetching such as reactive ion etching with the use of $CF_4+H_2$ gas. The composition of the $CF_4+H_2$ gas is different from that of the $CF_4+H_2$ gas for the etching of the silicon nitride film 5' in that the ratio of the $CF_4$ gas is increased for the etching of the silicon oxide film. The second interlaid electric insulator film 4 of silicon oxide is thus etched by the $CF_4+H_2$ gas while the first interlaid electric insulator film 5 of silicon nitride resists etching. As a result, even if the contact hole 6 is displaced relative to the first wiring layer 2 of aluminum due to the alignment failure, the silicon nitride first interlaid electric film 5 prevents the contact hole 6 from extending to the silicon substrate 1 because of the second interlaid electric insulator film 4 of silicon oxides.

Subsequently, the second wiring layer 3, made of a thin aluminum film of a thickness of 0.8 microns to 1 microns, is placed on the first wiring layer 2 of aluminum and the second interlaid electric insulator film of silicon oxide film 4 via a conventional sputtering process as shown in FIG. 1. The first wiring layer 2 of aluminum and the second wiring layer 3 of aluminum are thereby connected to each other through the contact hole 6 so that the semiconductor integrated circuit of multilayered wiring structure is completed.

Figure 4:
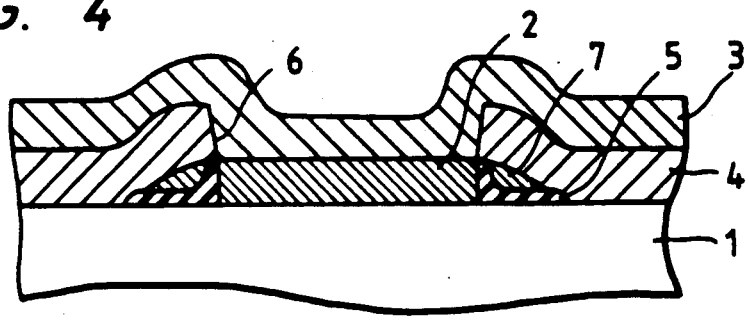
FIGS. 4 and 5 are cross-sectional views of the second embodiment of the semiconductor integrated circuit.
Figure 5:
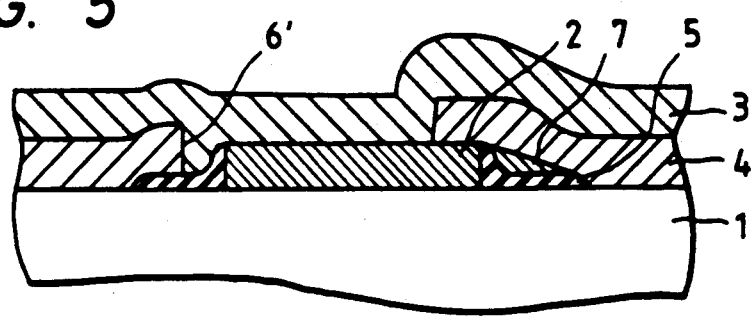

FIGS. 4-6 show the second embodiment of the semiconductor integrated circuit. The same reference symbols used in FIGS. 1 and 4 denote the same elements. Note, elements 5' and 7' represent the respective films upon initial application while elements 5 and 7 show the films as they ultimately appear..

As shown in FIG. 4, a first interlaid electric insulator film consisting of a silicon nitride film 5 and a SOG (spin-on-glass) layer 7 is, made on the wall and the proximate vicinity thereof of a first wiring layer 2 of aluminum. Because of the presence of the spin-on-glass layer 7 in particular, the top of the first wiring layer 2 and that of a semiconductor substrate 1 are less steeply bridged to one another as compared to the first embodiment. For that reason, the first wiring layer 2 is more properly covered with a second interlaid electric insulator film 4 made of silicon oxide.

A contact hole 6 is made in the silicon oxide layer 4 by etching. FIG. 5 demonstrates the contact hole 6 which is not formed in the desired position due to an alignment failure wherein the first interlaid electric insulator film 5 of silicon nitride prevents the contact hole from extending to the substrate 1, despite the possible etching of the spin-on-glass film 7.

Figure 6A:
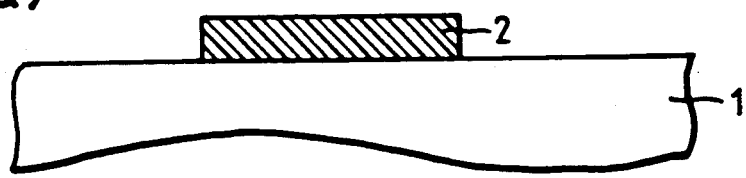
FIG. 6 is a multiple step cross-sectional representation of the method of manufacturing the second embodiment of the semiconductor integrated circuit.

An example of a method of manufacturing the second embodied semiconductor integrated circuit is now described with reference to FIG. 6 To provide the first wiring layer 2, as shown in FIG. 6(a), a thin aluminum film is made at a thickness of 0.8 microns to 1 microns on the silicon substrate 1 by a sputtering process and subjected to conventional photoetching.

Figure 6B:
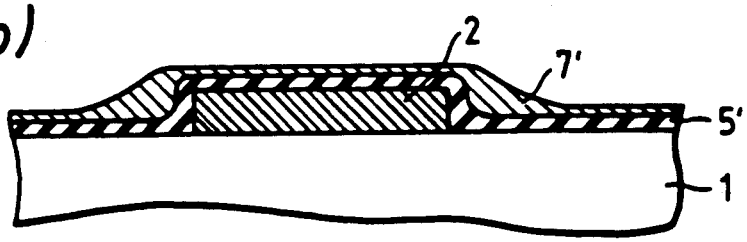

Next, FIG. 6(b) shows the first interlaid electric insulator film of silicon nitride 5' which has a different reaction to etching from that of the second interlaid electric insulator film 4 of silicon oxide, deposited at a thickness of 0.2 microns to 0.4 microns by a plasma chemical vapor deposition process at a temperature of 350° C. or less so as not to produce an adverse effect such as the generation of a hillock on the aluminum layer 2. Spin-on-glass, prepared by dissolving glass ingredients in a solvent, is then rotatively or centrifugally cast applied to the silicon nitride film 5' and subjected to conventional baking so that a spin-on-glass film 7' is made. Since the spin-on-glass film 7' is made through the rotative technique, the thickness of the film is increased on the wall of the silicon nitride film 5' yet thin on the flat portions thereof so that the top of the spin-on-glass film gradually slopes down from the top of the wall of the silicon nitride film toward the lower flat portion.

Figure 6C:
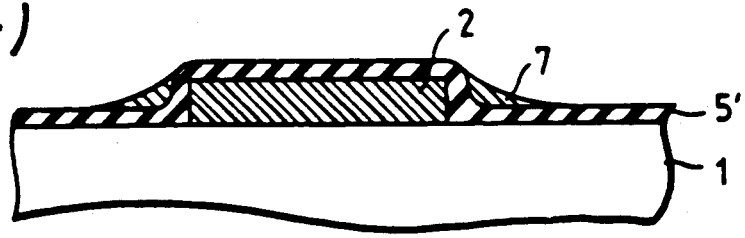

FIG. 6(c) illustrates the spin-on-glass film 7' which is subjected to slight dry etching with the use of $CF_4 + H_2$ gas so that the spin-on-glass film is removed from the flat portions of the silicon nitride film 5'. The flat portions are therefore exposed and the spin-on-glass film 7 is left only on the wall of the silicon nitride film and the proximate vicinity of the wall.

Figure 6D:
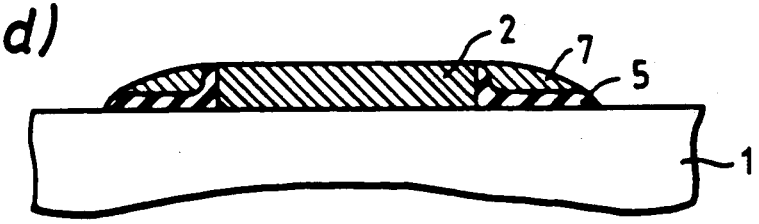

Thereafter, the ratio of $H_2$ to the $CF_4 + H_2$ gas is increased to etch the silicon nitride film 5' while avoiding the etching of the spin-on-glass film 7 thus the film is used as a mask, to expose the top of the aluminum layer 2 as shown in FIG. 6(d).

Figure 6E:
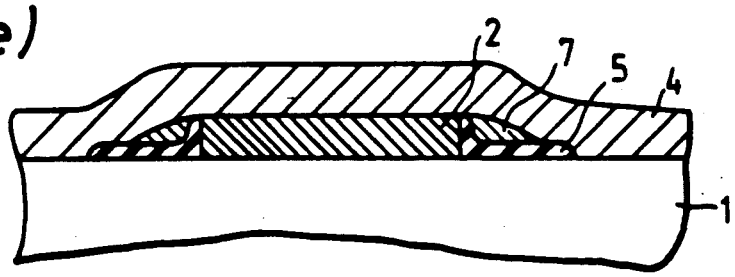

The second interlaid electric insulator film 4 of silicon oxide having a thickness of 1.5 microns to 2.0 microns and made by a pressure-reduction chemical vapor deposition process is then made as shown in FIG. 6(e). At that time, the first wiring layer 2 of aluminum is properly and uniformly covered with the second interlaid electric insulator film 4 of silicon oxide because the top of the aluminum layer and that of the substrate 1, which has a different height therefrom, are gradually bridged to one other by the silicon nitride film 5 and the spin-on-glass film 7.

Figure 6F:
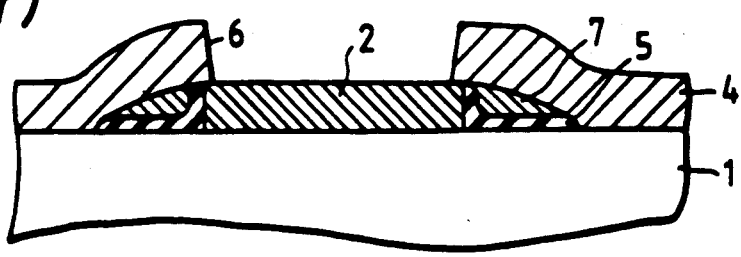

FIG. 6(f) depicts the results of the application of conventional photoetching performed with the use of $CF_4 + H_2$ gas. The ratio of $CF_4$ is increased to make it more likely to etch the second interlaid electric insulator film 4 of silicon oxide so that the contact hole 6 is made in the silicon oxide film. A second wiring layer 3 of aluminum is then made with 0.8 microns to 1 microns thickness by a conventional sputtering process and subjected to photoetching so that a second wiring layer 3 generates the desired pattern or structure as shown in FIG. 4. The multilayered wiring structure of the semiconductor integrated circuit is thus completed.

Figure 7:
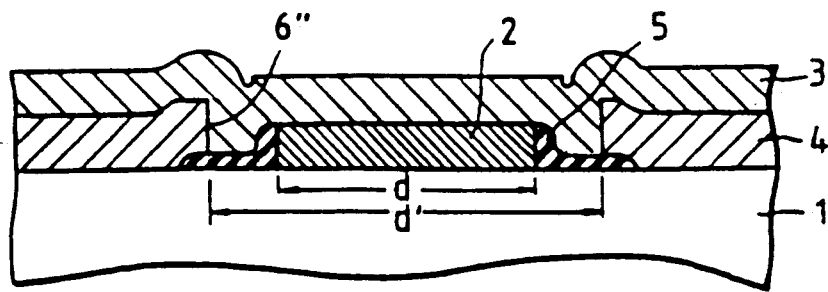
FIG. 7 is a cross-sectional view depicting the application of the invention relating to the semiconductor integrated circuit
Figure 8A:
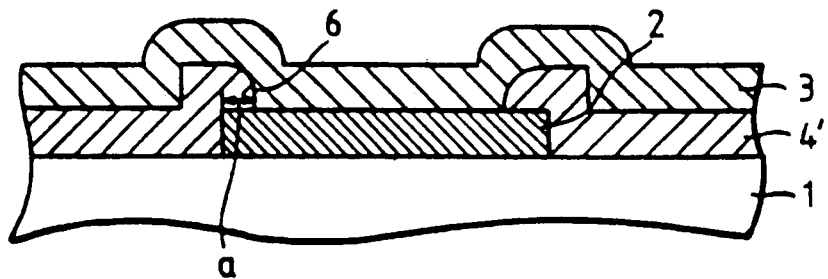
FIG. 8(a) is a cross-sectional view of the prior art conventional semiconductor integrated circuit.
Figure 8B:
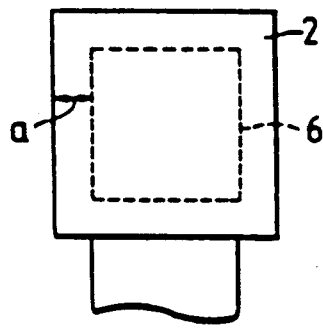
FIG. 8(b) is a plan view of the prior art conventional semiconductor integrated circuit.

FIG. 7 shows another embodiment of the present invention wherein a contact hole 6" whose width d' is larger than that d of a first wiring layer 2 is formed. The width of the hole affects the adequacy of the layer deposition. That is, if the width of the contact hole, provided in a first wiring layer is smaller, some materials such as aluminum are less likely to be sufficiently deposited via a sputtering process on the inside surface edge of the contact hole. The resultant difficulty is thus a circuit disconnection. For that reason, the width of the contact hole is made large enough to surely deposit the second wiring layer well to prevent the circuit disconnection.

Although in the above-described embodiments the first interlaid electric insulator film is made of silicon nitride using plasma chemical vapor deposition, the spin-on-glass film and the second interlaid electric insulator film are made of the silicon oxide using pressure-reduction chemical vapor deposition, the present invention is not confined thereto but may be otherwise embodied so that at least two kinds of films different in an etching property from each other are provided instead of the silicon nitride film, the spin-on-glass film and the silicon oxide film. For example, a silicon oxide film made through plasma chemical vapor deposition, a glass film doped with phosphorus, a glass film doped with phosphorus and made through pressure-reduction chemical vapor deposition, a glass film doped with phosphorus and made through normal-pressure chemical vapor deposition, a silicon oxide film made through normal-pressure chemical vapor deposition or the like may be provided as the second interlaid electric insulator film.

Although the wiring layers are made of aluminum in the above-described embodiments, the present invention is not confined thereto and the wiring layers may be made of a high-melting-point metal such as tungsten and molybdenum, a silicide, or an aluminum alloy consisting of aluminum and copper.

Other embodiments of the invention will be apparent to those skilled in the art from consideration of the specification and practice of the invention disclosed herein. It is intended that the specification and examples be considered as exemplary only with the true scope and spirit of the invention being limited only by the following claims.

What is claimed is:

1. A method of making a semiconductor integrated circuit having a substrate, comprising the steps of:
    forming a first conductive wiring layer on said substrte via sputtering;
    photopatterning said formed first wiring layer to generate a circuit pattern;
    forming a first interlaid electric insulator film over said photopatterned first wiring layer via plasma chemical vapor deposition;
    anisotropic dry-etching said formed first interlaid insulator film with a first gas including $CF_4$ and $H_2$ to remove a portion of said first interlaid electric insulator film and expose at least a portion of said photopatterned first wiring layer;

forming a second interlaid electric insulator film over said dry-etched first interlaid insulator film and said exposed portion of said photopatterned first wiring layer via pressure-reduction chemical vapor deposition;

photopatterning said second interlaid electric insulator film to form a contact hole therein by reactive ion-etching said second interlaid electric insulator film with a second gas including $CF_4$ and $H_2$ to remove a portion of said second interlaid electric insulator film and re-exposed said exposed portion of said photopatterned first wiring layer, said second gas having a higher ratio of $CF_4$ to $H_2$ than that in said first gas; and forming a second conductive wiring layer over said photopatterned second interlaid insulator film via sputtering to form a contact with said re-exposed portion of said photopatterned first wiring layer.

2. A method of making a semiconductor integrated circuit according to claim 1, further comprising the step of rotatively applying or centrifugally casting a spin-on-glass film over said formed first interlaid insulator film and subsequently baking said glass film, before forming said second interlaid insulator film thereover.

* * * * *